United States Patent
Inoue et al.

(10) Patent No.: US 7,126,102 B2
(45) Date of Patent: Oct. 24, 2006

(54) PHOTOELECTRIC CONVERSION DEVICE AND CAMERA USING PHOTOELECTRIC CONVERSION DEVICE

(75) Inventors: Shunsuke Inoue, Kanagawa (JP); Hiroshi Yuzurihara, Kanagawa (JP); Tetsuya Itano, Tokyo (JP)

(73) Assignee: Canon Kabushiki Kaisha, Tokyo (JP)

(*) Notice: Subject to any disclaimer, the term of this patent is extended or adjusted under 35 U.S.C. 154(b) by 146 days.

(21) Appl. No.: 10/747,369

(22) Filed: Dec. 30, 2003

(65) Prior Publication Data

US 2004/0188597 A1     Sep. 30, 2004

(30) Foreign Application Priority Data

Jan. 6, 2003 (JP) .............. 2003-000390
Sep. 11, 2003 (JP) .............. 2003-319911

(51) Int. Cl.
*G01J 1/44* (2006.01)
*H01J 40/14* (2006.01)
*H03F 3/08* (2006.01)
*H01L 31/062* (2006.01)
*H01L 31/113* (2006.01)

(52) U.S. Cl. .................. 250/214 R; 257/290
(58) Field of Classification Search .......... 250/214 R, 250/214.1; 257/437, 290
See application file for complete search history.

(56) References Cited

U.S. PATENT DOCUMENTS 6,166,405 A * 12/2000 Kuriyama et al. .......... 257/290
6,635,912 B1   10/2003 Ohkubo .................. 257/292
2004/0080009 A1 * 4/2004 Sandhu et al. ............. 257/437

FOREIGN PATENT DOCUMENTS

| JP | 63-044761 | 2/1988 |
| JP | 11-233750 | 8/1999 |
| JP | 2000-012822 | 1/2000 |
| JP | 2000-12822 | 1/2000 |
| JP | 2001-111022 | 4/2001 |
| JP | 2001-291857 | 10/2001 |
| JP | 2001291857 A * | 10/2001 |
| JP | 2002-083949 | 3/2002 |

OTHER PUBLICATIONS

Japanese Patent Office Official Letter, Jan. 17, 2005 (translation).
Japanese Patent Office Official Letter, Apr. 20, 2005 (translation).

* cited by examiner

*Primary Examiner*—Georgia Epps
*Assistant Examiner*—Brian J. Livedalen
(74) *Attorney, Agent, or Firm*—Fitzpatrick, Cella, Harper & Scinto

(57) ABSTRACT

A photoelectric conversion device has pixels arranged in an array. Each pixel includes a light receiving region for converting light to signal charges and an insulation film formed on a surface of the light receiving region. Each pixel further includes transistors, including an amplifying transistor for amplifying the signal charges. A reflection prevention film is provided that has a refractive index higher than that of the insulation film and is arranged above the light receiving region, with the insulation film disposed between the reflection prevention film and the light receiving region. Film thicknesses of the insulation film and gate insulation films of the transistors are different from each other.

8 Claims, 10 Drawing Sheets

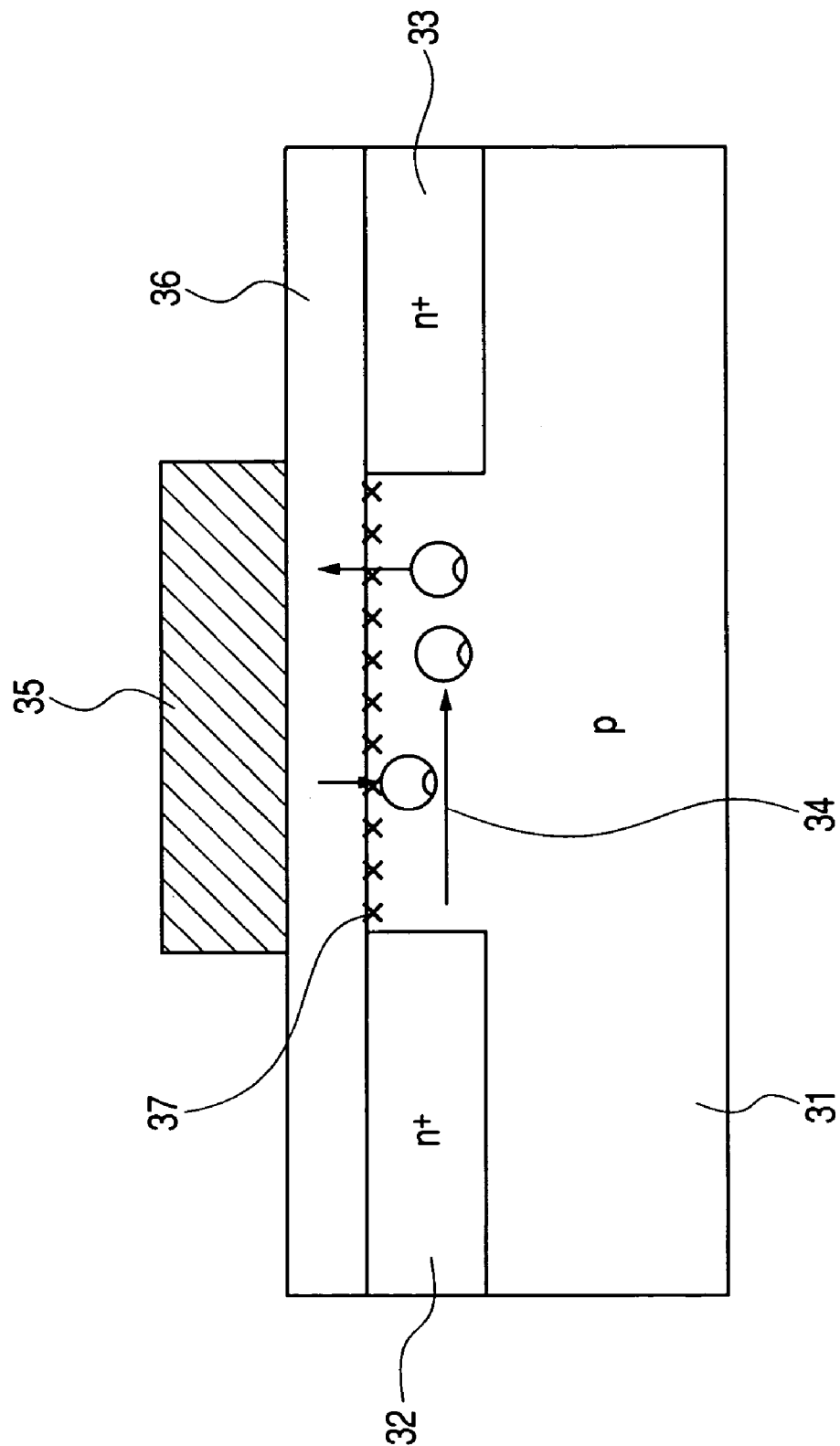

PHOTOELECTRIC CONVERSION DEVICE AND CAMERA USING PHOTOELECTRIC CONVERSION DEVICE

BACKGROUND OF THE INVENTION

1. Field of the Invention

The present invention relates to a solid state image pickup device, more particularly to a metal oxide semiconductor (MOS) type solid state image pickup device and a method for manufacturing the same.

2. Description of Related Art

Recently, demand for a photoelectric conversion device has rapidly increased as an image pickup device of a two-dimensional image input device of a digital still camera and a video cam recorder primarily, or as a one-dimensional image reading device of a facsimile and a scanner primarily.

A charge-coupled device (CCD) and a MOS type sensor are used as the photoelectric conversion devices for these uses. A complementary metal oxide semiconductor (CMOS) photoelectric conversion device has been put to practical use as a representative of the MOS type photoelectric conversion devices. FIG. 14 is a general circuit configuration diagram of a pixel carrying a CMOS sensor. In FIG. 14, a reference numeral 1 designates a photodiode. A reference numeral 2 designates a transfer MOS transistor for transferring signal charges generated by the photodiode 1. A reference numeral 3 designates a floating diffusion region (hereinafter referred to as "floating diffusion") for storing the transferred signal charges temporarily. A reference numeral 4 designates a resetting MOS transistor for resetting the floating diffusion 3 and the photodiode 1. A reference numeral 5 designates a selection MOS transistor for selecting an arbitrary row in an array. A reference numeral 6 designates a source follower MOS transistor for converting the signal charges of the floating diffusion 3 to a voltage to amplify the converted voltage by a source follower type amplifier. A reference numeral 7 designates a sense line, which is commonly used for one column to read pixel voltage signals. A reference numeral 8 designates a constant current source for flowing a constant current on the sense line 7.

It is needless to say that the present pixel circuit configuration can be applied to the present invention.

FIG. 15 is a schematic sectional view of a pixel carrying the conventional CMOS sensor. FIG. 15 especially shows a part composed of the photodiode 1 and the transfer MOS transistor 2 in FIG. 14. A reference numeral 11 designates an n type silicon substrate. A reference numeral 12 designates a P type well. A reference numeral 13a designates a gate oxide film of the MOS transistor 2. A reference numeral 13b designates a thin oxide film on a light receiving portion. A reference numeral 14 designates a gate electrode of the transfer MOS transistor 2. A reference numeral 15 designates an N type cathode of the photodiode 1. A reference numeral 16 designates a surface P type region for designing the photodiode 1 to have a buried structure. A reference numeral 17 designates a selection oxide film for isolating elements. A reference numeral 18 designates an N type high concentration region, which forms the floating diffusion 3 and is also the drain region of the transfer MOS transistor 2. A reference numeral 19 designates a silicon oxide film for insulating the gate electrode 14 from a metal first layer 21. A reference numeral 20 designates a contact plug. The reference numeral 21 designates the metal first layer. A reference numeral 22 designates an interlayer insulation film for insulating the metal first layer 21 from a metal second layer 23. The reference numeral 23 designates the metal second layer. A reference numeral 24 designates an interlayer insulation film for insulating the metal second layer 23 from a metal third layer 25. The reference numeral 25 designates the metal third layer. A reference numeral 26 designates a passivation film. In a color photoelectric conversion device, a not shown color filter layer, and further a not shown microlens for improving sensitivity are formed as upper layers of the passivation film 26. The light which has entered from the surface passes through an opening portion where the metal third layer 25 is not formed, and enters the photodiode. The light is absorbed in the N type cathode 15 or the P type well 12 to generate electron-hole pairs. Among them, the electrons are accumulated in the N type cathode 15.

Moreover, Japanese Patent Application Laid-Open No. 2000-12822 discloses a solid state image pickup device including a plurality of pixels formed in a semiconductor substrate. The pixels severally include a light receiving portion and a diffusion region, to which signal charges are transferred from the light receiving portion. In the solid state image pickup device, a reflection prevention film is formed above the semiconductor substrate with an insulation film interposed between the reflection prevention film and the semiconductor substrate in the light receiving portion. The reflection prevention film is formed so as to avoid at least a part above the diffusion region.

However, a part of the incident light does not enter the photodiode owing to the optical reflection on the interface between the surface P type region 16 and the thin oxide film 13b on the photodiode. The loss of the reflection can be expressed by the following formula.

$$(Nsi(\lambda) - Nsio2(\lambda))^2 / (Nsi(\lambda) + Nsio2(\lambda))^2 \qquad (1)$$

where $Nsi(\lambda)$ designates the refraction index of silicon at the wavelength $\lambda$; $Nsio2(\lambda)$ designates the refraction index of a silicon oxide film at the wavelength $\lambda$.

As apparent from the formula (1), the larger the difference of refraction indices of adjoining two films is, the larger the ratio of reflection is. In the cross section structure shown in FIG. 15, all of the interlayer insulation films 19, 22, 24 and 26 are silicon oxide films. A flattened resin having a refraction index close to the refraction indices of the silicon oxide films is formed on the passivation film 26. Consequently, the maximum loss is generated on the interface between silicon (Nsi=4 to 5) and a silicon oxide film (Nsio2=1.4 to 1.5). In a CMOS type photoelectric conversion device, the surface of silicon of a photodiode adjoins a silicon oxide film, and consequently the lowering of the sensitivity of the photodiode has been produced.

Next, the reasons why noises are large will be described.

There are fixed pattern noises and random noises in the noise components to be generated in a CMOS type sensor. Hereupon, the random noises are noticed among them. Because the noise components to be generated in the source follower MOS transistor 6 among the random noise components have outputs in proportion to the 1/f of a drive frequency f of the MOS transistor 6, the noise components are called as 1/f noises. It is said that the 1/f noises are generated because carriers are randomly charged and discharged at a trap level of the interface between silicon and a silicon oxide film of a MOS transistor (see FIG. 16). FIG. 16 is a sectional view of a MOS transistor for illustrating the 1/f noises. FIG. 16 exemplifies an NMOS transistor. The NMOS transistor includes a gate electrode 35 above a P type substrate 31 with a gate oxide film 36 between, and an N+ type source 32 and a drain 33, both formed on the surface of the transistor. Because channel electrons 34 to flow by the application of a voltage between the gate electrode 35 and the drain 33 are influenced by the charging and the discharging of charges at a trap 37 of the gate oxide film 36, drain currents randomly fluctuate at every operation. The fluctuation is the cause of the 1/f noises. Moreover, because the largeness of the noises is in inverse proportion to the size of the MOS transistor, the finer a pixel is, the larger the noises are. Because the other random noises and fixed pattern noises have been lowered by the improvement of design such as contrivances of a circuit and a device, the 1/f noises has occupied a large portion in the whole random noise components.

SUMMARY OF THE INVENTION

As a method for achieving the above-mentioned object, the present invention is a photoelectric conversion device including pixels arranged in an array, each of the pixels comprising:

a light receiving region for converting light to signal charges;

an insulation film formed on a surface of the light receiving region; and transistors including an amplifying transistor for amplifying the signal charges to output the amplified signal charges, wherein a reflection prevention film having a refractive index higher than that of the insulation film is arranged above the light receiving region with the insulation film interposed between the reflection prevention film and the light receiving region, and film thicknesses of the insulation film and gate insulation films of the transistors are different from each other.

Moreover, a method for manufacturing a photoelectric conversion device including pixels arranged in an array, each of the pixels including: a light receiving region for converting light to signal charges; an insulation film formed on a surface of the light receiving region; and transistors including an amplifying transistor for amplifying the signal charges to output the amplified signal charges, the method comprising the steps of:

arranging a reflection prevention film having a refractive index higher than that of the insulation film above the light receiving region with the insulation film interposed between the reflection prevention film and the light receiving region, and oxidizing the insulation film again after forming gate electrodes of said transistors.

Moreover, a method for manufacturing a photoelectric conversion device including pixels arranged in an array, each of the pixels including: a light receiving region for converting light to signal charges; an insulation film formed on a surface of the light receiving region; and transistors including an amplifying transistor for amplifying the signal charges to output the amplified signal charges, the method comprising the steps of:

arranging a reflection prevention film having a refractive index higher than that of the insulation film above the light receiving region with the insulation film interposed between the reflection prevention film and the light receiving region;

removing the insulation film once after forming gate electrodes of the transistors; and performing re-oxidization.

The operation of a first claim is as follows.

The surface of a photodiode is configured to be a silicon oxide film/a silicon nitride film/a silicon oxide film. Thereby, by means of the multiple interference phenomenon of a thin film, the reflection in a visible light region is suppressed, and the film thicknesses of an insulation film between a silicon substrate and a high refraction index film and a gate insulation film of a transistor are severally optimized. Thereby, a reflection prevention effect and the properties of the transistor are reconciled.

In a second claim, a high dielectric constant film is removed above at least a source follower MOS transistor. Thereby, hydrogen molecules to be diffused from a surface at the time of performing a hydrogen termination process in a later manufacturing process are not intercepted by the high dielectric constant film, and a trap of a gate oxide film of the transistor can be terminated. Consequently, the effect of the improvement of sensitivity by the reflection prevention and the effect of the reduction of 1/f noises by the termination of hydrogen can be more effectively reconciled.

In a third claim, the high dielectric constant film is made of a silicon nitride film formed by a thermochemical vapor deposition method, which can be generally available at in a high temperature process (>600° C.) of silicon. Thereby, a thin film which has brought results in material properties, process properties and reliability can be used for reflection prevention. Moreover, the insulation film above the silicon substrate is made of a silicon oxide film. Thereby, by adding an oxidization process after the formation of a gate electrode of the transistor, a film thickness of the insulation film can be selected so as to reconcile the reflection prevention effect and the properties of the transistor.

In a fourth claim, a silicon oxide film is formed on a side wall of a polysilicon gate electrode. Thereby, it is prevented for the silicon nitride film of the reflection prevention film from touching the gate electrode directly, and the stabilization of the properties of the transistor and the reflection prevention effect can be reconciled.

In a fifth claim, by isolating the high dielectric constant film at every pixel, the reflection prevention effect can be obtained while the stress of the high dielectric constant film, which frequently works as a large tensile stress to silicon, is relaxed.

In a sixth claim, the high dielectric constant film is formed to be a silicon nitride film by a hydrogen-rich plasma chemical vapor deposition method. Thereby, a trap at an interface of the transistor or a trap at the interface of silicon/a silicon oxide film on the photodiode can be more effectively decreased.

In a seventh claim, the trap at the interface of silicon/a silicon oxide film is terminated by hydrogen. Consequently, the hydrogen in the silicon nitride film formed by the plasma chemical vapor deposition can be effectively dissociated by a heat process.

The operation of an eighth claim is the same as that of the third claim.

In a ninth claim, it becomes possible to reduce the difference between the refractive indices of the reflection film and the interlayer insulation film. Consequently, further reduction of the reflection ratio can be achieved.

Hence, because the incident light into the sensor can be converted to charges more efficiently than the prior art by the present invention, the sensitivity of the sensor is improved.

Moreover, by using a hydrogen-rich film as the reflection prevention film, the trap level of the source follower MOS transistor, which has been primary factor of the random noises in the sensor, can be lowered. Consequently, the noises of the sensor can be also reduced.

Moreover, by adding oxidization process after the formation of the polysilicon gate electrode, the thickness of a silicon oxide film can be selected so as to reconcile the reflection prevention conditions and the properties of the transistor. Moreover, in the case where the silicon nitride film for reflection prevention is commonly used for a side spacer, the silicon nitride film works as a stress relaxing layer.

Furthermore, by adopting a configuration in which two or more layers of reflection prevention films are laminated above at least a part of the photoelectric conversion portion with an insulation film between, the difference between the refractive indices of the reflection prevention film and the interlayer insulation film becomes small. Consequently, the reflection at the interface can be sufficiently suppressed, and then a photoelectric conversion device having further higher sensitivity can be provided. Moreover, by forming the thicknesses of the first reflection prevention film and the second reflection prevention film suitably, it becomes possible to lowering the loss of incident light by means of the optical interference operation of these films, and thereby the further improvement of the sensitivity of a photoelectric conversion device can be achieved.

BRIEF DESCRIPTION OF THE DRAWINGS

FIG. 16 is a view for illustrating 1/f noises of a MOS transistor.

DESCRIPTION OF THE PREFERRED EMBODIMENTS

In the following, the preferred embodiments of the present invention will be described in detail by the use of the attached drawings.

(First Embodiment)

Figure 1:
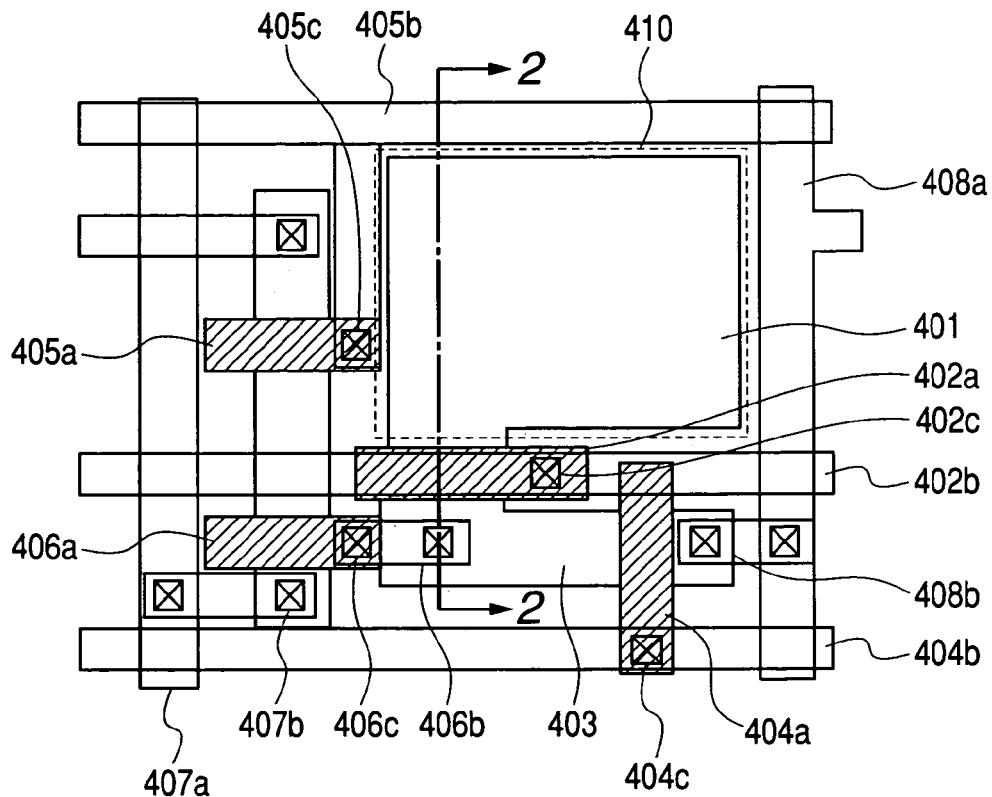
FIG. 1 is a plan view of a pixel of a CMOS sensor of a first embodiment of the present invention.

FIG. 1 is a schematic view showing the configuration of a pixel of a photoelectric conversion device of a first embodiment of the present invention. In FIG. 1, a reference numeral 401 designates a photodiode, which is a light receiving region for generating and storing charges according to incident light. A reference numeral 402*a* is a gate electrode of a transfer MOS transistor for transferring generated signal charges to floating diffusion. As the gate electrode 402*a*, for example, polysilicon is used. A reference numeral 402*b* designates a transfer line made of a metal for connecting a transfer electrode in an array. A reference numeral 402*c* designates a contact portion connecting the transfer gate 402*a* to a transfer line 402*b*. A reference numeral 403 designates a floating diffusion region (hereinafter referred to as "floating diffusion") for storing the transferred charges temporarily. A reference numeral 404*a* designates a gate of a reset MOS transistor for resetting the floating diffusion or the photodiode 401 before the storing of charges. A reference numeral 404*b* designates a reset line for connecting the reset MOS transfer gate 402*a* in an array. A reference numeral 404*c* designates a contact portion for connecting the gate 402*a* of the reset MOS transistor to the reset line 402*b*. A reference numeral 405*a* designates the gate of a selection MOS transistor for selecting a pixel to be read. A reference numeral 405*b* designates a selection line for connecting selection MOS transistors to each other. A reference numeral 405*c* designates a contact portion for connecting the gate 405*a* of the selection MOS transistor to the selection line 405*b*. A reference numeral 406*a* designates the gate of a source follower MOS transistor for detecting and amplifying the potential at the floating diffusion 403. A reference numeral 406*b* designates metal wiring for connecting the gate 406*a* of the source follower MOS transistor to the floating diffusion 403. A reference numeral 406*c* designates a contact portion for connecting the metal wiring 406*b* to the gate 406*a* of the source follower MOS transistor. A reference numeral 407*a* designates a sense line for taking out the signals read by the source follower MOS transistor to the outside of the pixel region. A reference numeral 407*b* designates a contact portion for connecting the sense line 407*a* to the source of the source follower MOS transistor. A reference numeral 408*a* designates a VDD power source line to be used for the power source of sense lines and a reset power source. A reference numeral 408*b* designates a contact portion for connecting the power source line 408*a* to the drain of the reset MOS transistor.

A region 410 indicated by a broken line to cover the photodiode 410 is a region where a silicon nitride film according the present invention lies as a reflection prevention film. In the present embodiment, as shown in FIG. 1, the silicon nitride film remains only in the photodiode portion needing reflection prevention. Consequently, there is no nitride film on a MOS transistor, and the reflection prevention film is not connected to the reflection prevention films of the adjoining pixels.

The reflection prevention film 410 in the present embodiment uses a silicon nitride film formed by performing the vapor phase growth of a reacted silane gas and an ammonia gas at a temperature in the range of 550° C. to 650° C. in a reduced pressure. The refraction index of the reflection prevention film 410 is 2.0 at the wavelength of 550 nm. Because it is known that hydrogen molecule is difficult to permeate the silicon nitride film 410, hydrogen diffusing from the surface of the device in a hydrogen sintering process is difficult to enter beneath the reflection prevention film. For reducing the trap levels of the four MOS transistors in the pixel, all of the silicon nitride films on the MOS transistor are removed. Thereby, especially the 1/f noises of the source follower MOS transistors are prevented from increasing. Because hydrogen desirably also enters the interface of the photodiode, it is effective to remove a part of the nitride film without covering the whole photodiode as in the present embodiment. In that case, it is preferable to remove the region having low incident light density.

The silicon nitride film 410 formed by the reduced pressure chemical vapor deposition (CVD) method has a large tensile stress to silicon. By the tensile stress of the nitride film, warping of a *silicon substrate is generated. In an extreme case, there is a case where wafer chucking in the successive processes is hindered. Also for relaxing such a stress of the silicon nitride film, it is effective to isolate the nitride film between adjoining pixels as in the present embodiment.

Figure 2:
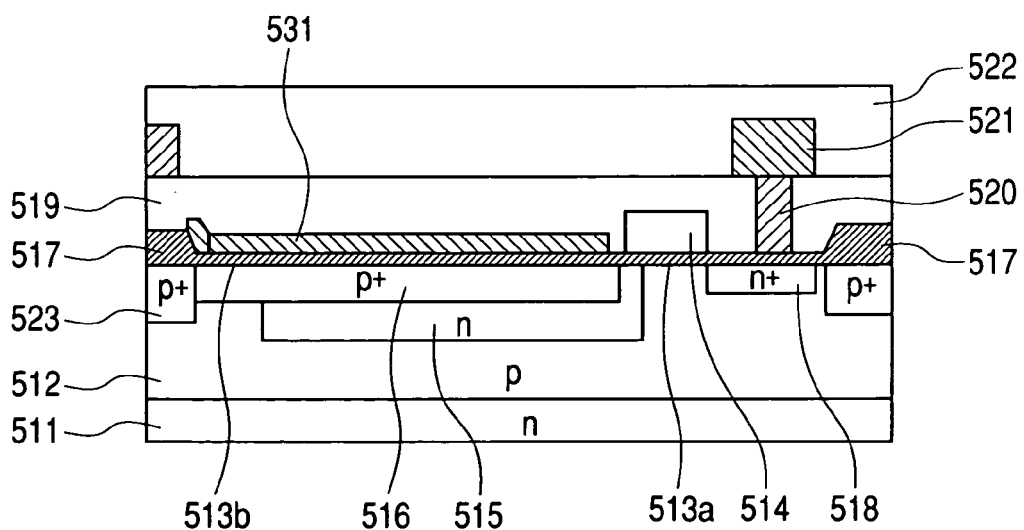
FIG. 2 is a sectional view of the pixel of the CMOS sensor of the first embodiment of the present invention.

FIG. 2 is a schematic sectional view taken along a 2—2 line in FIG. 1.

A reference numeral 511 designates an n type silicon substrate. A reference numeral 512 designates a P type well. A reference numeral 513*a* designates a gate oxide film of the MOS transistor. A reference numeral 513*b* designates a thin oxide film on the light receiving portion. A reference numeral 514 designates a gate electrode (corresponding to the gate electrode 402*a* in FIG. 1) of the transfer MOS transistor. A reference numeral 515 designates an N type cathode of the photodiode 401. A reference numeral 516 designates a surface P type region for designing the photodiode 401 to have a buried structure. A reference numeral 517 designates a mesa type oxide film for isolating elements. Because the element isolation by means of the mesa type oxide film scarcely generates a stress which is generated by the isolation by the local oxidation of silicon (LOCOS) method, the element isolation by the mesa type oxide film has an advantage that a leakage current of the photodiode at the end of the oxide film is small. Consequently, the element isolation by the mesa type oxide film is one suitable for a fine pixel structure. If there is no problem concerning the leakage current, the adoption of the isolation structure by the ordinary LOCOS oxide film is not contradictory to the sprit of the present invention. Moreover, the adoption of the shallow trench isolation (STI) as the element isolation method is not contradictory to the sprit of the present invention. A reference numeral 518 designates an N type high concentration region of the floating diffusion region (floating diffusion). A reference numeral 519 designates a silicon oxide film for insulating the gate electrode 514 from a metal first layer 521. A reference numeral 520 designates a contact plug. The reference numeral 521 designates the metal first layer. A reference numeral 522 designates an interlayer insulation film for insulating the metal first layer 521 from a metal second layer. The structure of the upper portion which does not matter to the sprit of the present invention is omitted. Moreover, a reference numeral 523 designates a channel stop layer under the mesa type oxide film 517. A reference numeral 531 designates a silicon nitride film corresponding to the reflection prevention film 410 in FIG. 1.

Figure 3:
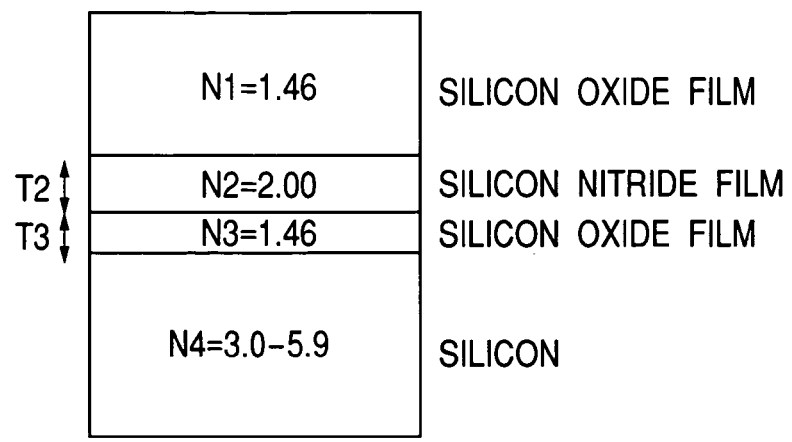
FIG. 3 is a schematic view showing a reflection prevention mechanism of the present invention.

FIG. 3 is a schematic diagram showing the reflection prevention structure of the present invention. As shown in FIG. 3, the silicon nitride film 531 lies between the thin oxide film 513*b* on the photodiode and the interlayer insulation film 519. The silicon nitride film 531 reduces the rate of the light reflecting by a multiple beam interference effect. Table 1 shows evaluations of reflection ratios at main wavelengths (450 nm, 550 nm and 620 nm) when some of the thicknesses of the silicon nitride film 531 and the silicon oxide film 513*b* in the structure of the present embodiment. It was ascertained that the reflection ratios, which were large in the case where T2=0 nm, i.e. in case of the conventional structure, decreased at all of the main wavelengths. It can be known that the main wavelengths at which the reflection prevention effect is large change according to the combinations of T2 and T3. Also it is known that all of the combinations are effective in the range of the experiments.

On the basis of the evaluation results, it is known that the ranges of T2=34–40 nm and T3=18–20 nm are suitable for producing the reflection prevention effect in well balance over all of the wavelengths. The effective range of T2 is about 10–60 nm, and the effective range of T3 is about 5–30 nm.

TABLE 1

EVALUATION VALUES OF REFLECTION PREVENTION STRUCTURE OF FIG. 6

| FILM THICKNESSES OF SAMPLES | | REFLECTION RATIO (%) | REFLECTION RATIO (%) | REFLECTION RATIO (%) |
|---|---|---|---|---|
| T2 (nm) | T3 (nm) | @ 450 nm | @ 550 nm | @ 620 nm |
| 0 | 15 | 36 | 25 | 22 |
| 40.5 | 17.8 | 7.5 | 7.5 | 7.8 |
| 50.0 | 9.0 | 10.0 | 6.5 | 7.0 |
| 40.4 | 19.9 | 8.9 | 6.0 | 6.0 |
| 34.5 | 17.8 | 8.0 | 8.2 | 8.5 |
| 50.2 | 17.8 | 11.5 | 5.0 | 4.0 |

(Second Embodiment)

Figure 4:
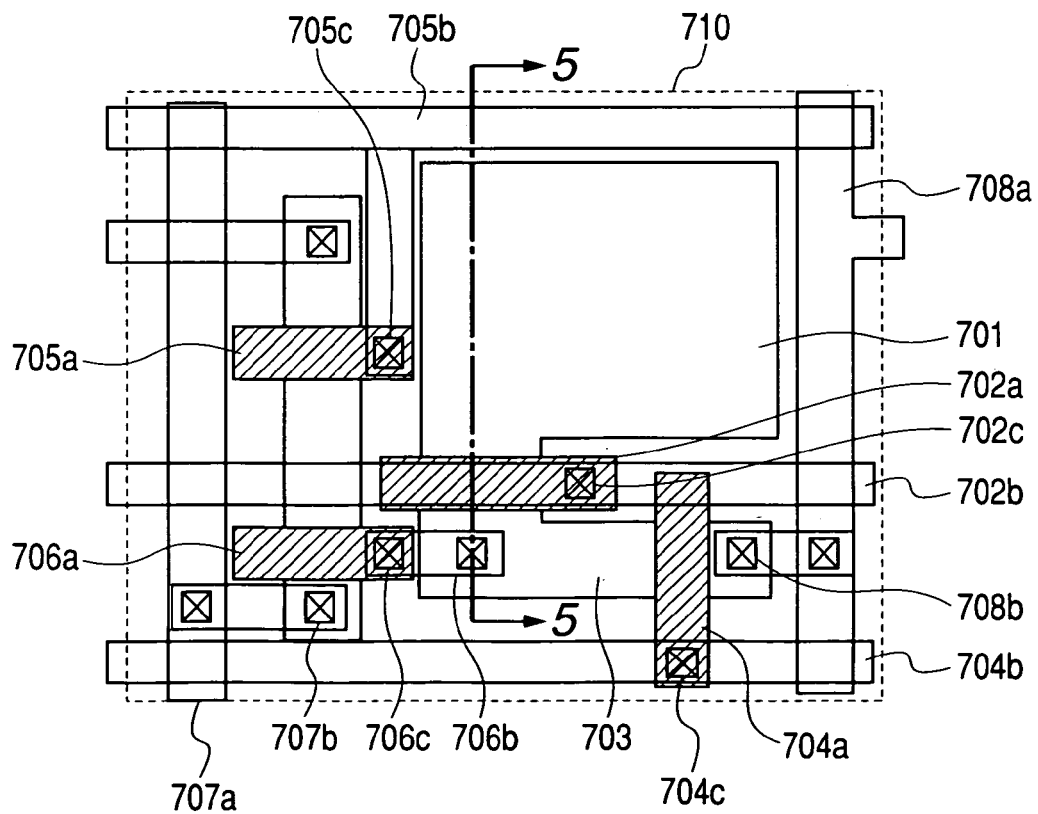
FIG. 4 is a plan view of a pixel of a CMOS sensor of a second embodiment of the present invention.

FIG. 4 is a schematic view showing the configuration of a pixel of a photoelectric conversion device of a second embodiment of the present invention.

The second embodiment differs from the first embodiment in that a film having a high refractive index for reflection prevention also lies in the regions other than a photodiode. A region 710 enclosed by a broken line is a region in which a silicon nitride film lies in a pixel. The broken line is for convenience sake, and the silicon nitride film lies to adjoining pixels continuously. Because the other parts are all the same as those in the embodiment 1, their descriptions are omitted.

Figure 5:
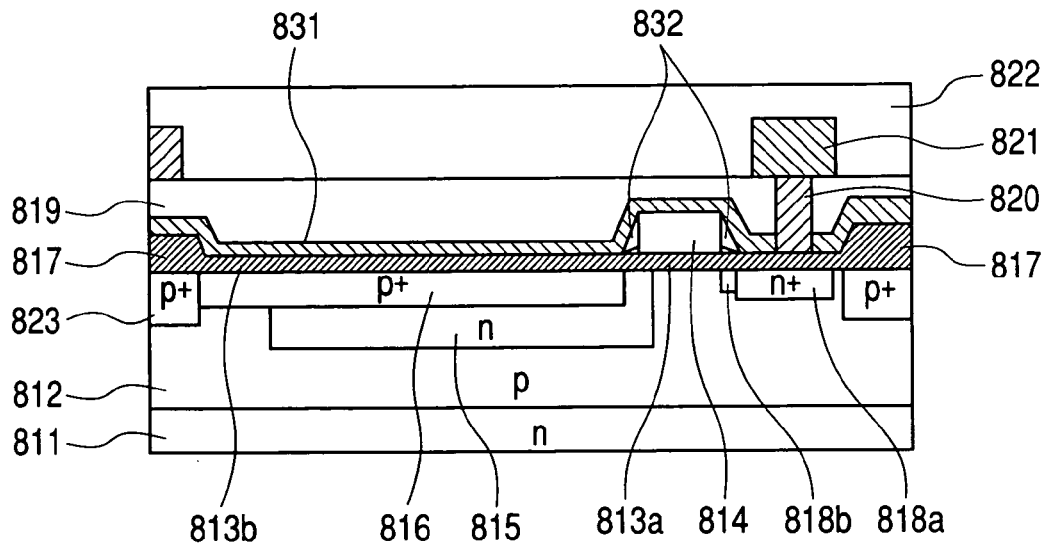
FIG. 5 is a sectional view of the pixel of the CMOS sensor of the second embodiment of the present invention.

FIG. 5 is a schematic sectional view taken along a line 5—5 in FIG. 4. As shown in FIG. 5, a silicon nitride film 831 lies all over the regions. FIG. 5 shows a MOS transistor having a lightly doped drain (LDD) structure. Consequently, an n type drain electric field relaxation layer 818*b* in a lower density than the density of a drain region 818*a* of the transfer MOS transistor lies on the channel side of the drain region 818*a*. The so-called side spacers (side walls) 832 are formed on both the sides of the polysilicon gate electrode 814 for obtaining the LDD structure. The thicknesses of the side spacers 832 in the side surface direction determine the size of the electric field relaxation layer 818*b*. In the case where the silicon nitride film remains on all over the surface as in the present embodiment, it is necessary to determine the thicknesses of the side spacers 832 in consideration with the thickness of the silicon nitride film 831.

Incidentally, it is needless to say that the present embodiment can be applied to the cases where the LDD structure is not adopted.

Because the sectional view of FIG. 5 shows the same configuration as that of the first embodiment except for the parts described above, the description thereof is omitted.

Incidentally, it is different from the first embodiment that the silicon nitride film used in the present embodiment is formed by the plasma chemical vapor deposition (P-CVD) method. That is, an ammonia gas and a silane gas are mixed in a plasma discharge to deposit a silicon nitride film on a wafer.

The nitride film obtained by the film-formation has a refractive index N=2.0. However, the refractive indices within a range n=1.9–2.1 can be obtained by changing the composition ratio of the gases. The optimum film thickness changes according to refractive indices.

The silicon nitride film formed by the P-CVD method has a small stress to silicon. When the film thickness of the silicon nitride film is 10 nm or less, there is no anxiety that the silicon wafer warps even if the film lies on the whole surface of the wafer. Consequently, there is no need to isolate the film at every pixel.

Moreover, the silicon nitride film formed by the P-CVD method includes several percents of hydrogen. It is well known that the hydrogen diffuses to the outside of the film when the film is heated to 350° C. or higher. A part of the diffused hydrogen molecules reaches the interface between silicon and a silicon oxide film, and embeds in the trap level in the oxide film. As a result, performing heat treatment of the structure of the present embodiment after the film formation of the P-CVD silicon nitride film made, it possible to decrease the 1/f noises of the source follower MOS transistor greatly. Even if the film thickness is 20 nm, a sufficient reduction effect of the 1/f noises can be obtained.

It is of course that, because the same reflection prevention effect as that of the first embodiment can be obtained, the sensitivity of the CMOS sensor is also improved.

As the result, the S/N ratio of the sensor was greatly improved.

Incidentally, the silicon nitride film remains on all over the face in the present embodiment, but the present invention is not limited to such structure. First, from the viewpoint of reducing the 1/f noises, it is important that the trap level of a source follower transistor is decreased. Consequently, if the silicon nitride film lies right above or in the vicinity of the gate 706a of the MOS transistor in the plan view of FIG. 4, then a sufficient effect can be obtained. Moreover, from the viewpoint of manufacturing, if the nitride film lies all over the surface, etching should be performed at two steps or three steps to make the process complicated and to lower the accuracy of working sizes when a contact hole is opened in an interlayer insulation film 819. Consequently, to remove the silicon nitride film at the contact position in advance is effective.

As described above, various possibilities exist in the remaining positions of the silicon nitride film, and all of the possibilities are not excluded from the present invention.

(Third Embodiment)

Figure 6:
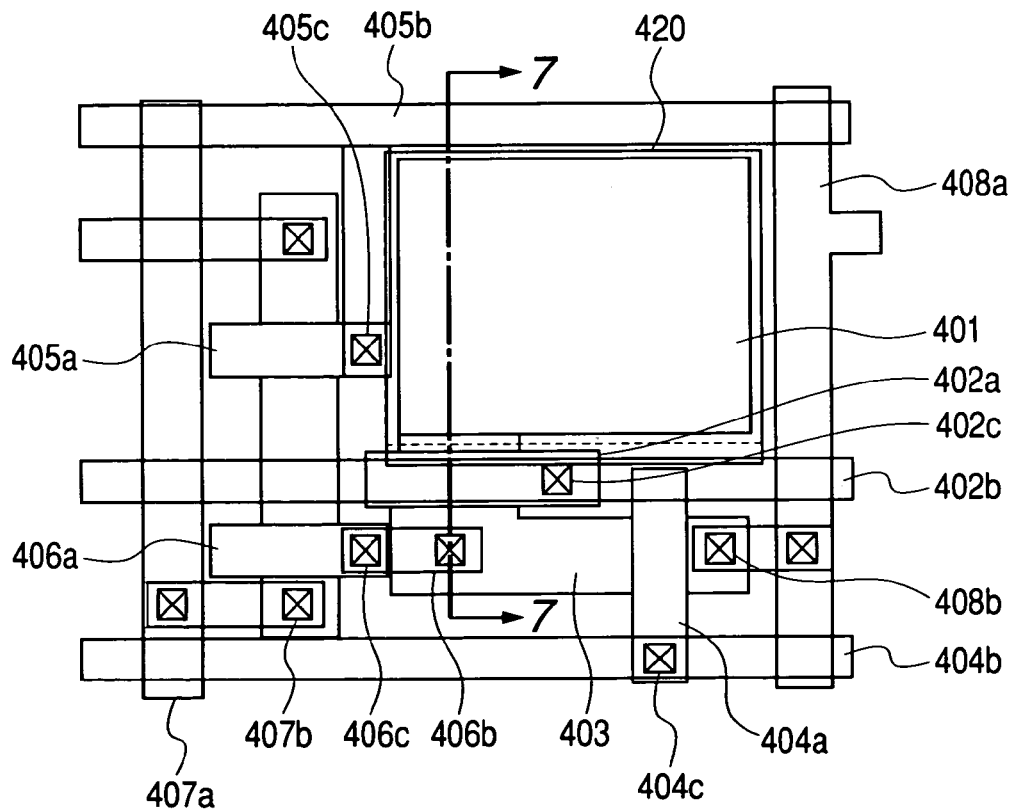
FIG. 6 is a plan view of a pixel of a CMOS sensor of a third embodiment of the present invention.

FIG. 6 is a schematic diagram showing the configuration of a pixel of an photoelectric conversion device of a third embodiment of the present invention.

Figure 7:
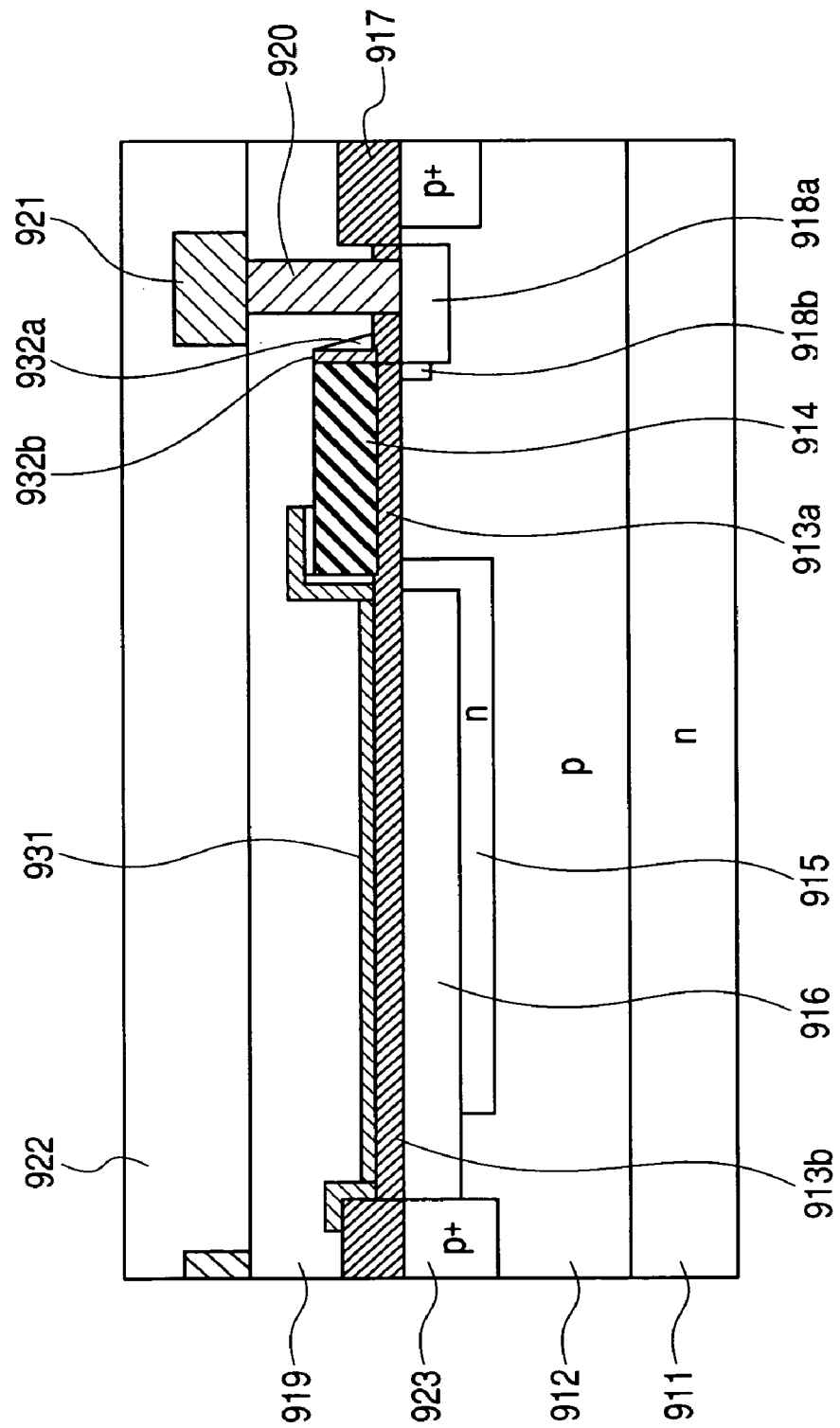
FIG. 7 is a sectional view of the pixel of the CMOS sensor of the third embodiment of the present invention.

FIG. 7 is a schematic sectional view taken along a line 7—7 in FIG. 6. The present embodiment differs from the first and the second embodiments in that the thickness of a silicon oxide film between a silicon nitride film, which is a high refractive film for reflection prevention, and a silicon substrate, and the thickness of a gate oxide film are severally optimized. For that sake, after the formation of a polysilicon gate electrode, an oxidation process is performed.

A reference numeral 913a designates a gate oxide film of a MOS transistor. A reference numeral 914 designates a polysilicon electrode. A reference numeral 913b designates a silicon oxide film on a photodiode. FIG. 7 shows the state in which film thicknesses are adjusted by performing oxidation after the formation of the polysilicon gate electrode 914. A reference numeral 931 designates a silicon nitride film for reflection prevention. A reference numeral 932b designates a silicon oxide film grown on a side wall of the polysilicon gate electrode 914 of the MOS transistor. A reference numeral 932a designates a side spacer of the silicon nitride film 931.

The region enclosed by a wide line 420 in FIG. 6 is the region where the silicon nitride film 931 lies as a reflection prevention film in the present embodiment. Because the structure of the pixel in FIG. 6 other than the parts described above is the same as that of the first embodiment, the descriptions of the structure are omitted. Incidentally, the region where the silicon nitride film 931 lies covers the whole region of the photodiode in FIG. 6, but, if the silicon nitride film is partially removed from the photodiode region, the remained state is not contradictory to the sprit of the present invention.

As shown in table 1, for increasing the effect of the reflection prevention, it is necessary to optimize the thicknesses of the silicon oxide film and the silicon nitride film. The silicon oxide film can be commonly used as the gate oxide film. However, from the requirement of the properties of the MOS transistor, the thickness of the silicon oxide film sometimes differs from the optimum film thickness for the reflection prevention.

Moreover, as shown in FIG. 7, the silicon nitride film for reflection prevention can be commonly used with the side spacer of the LDD structure. In that case, if the polysilicon gate electrode is touched to the silicon nitride film, the characteristics of the MOS transistor are sometimes influenced by the stress of the silicon nitride film. Accordingly, the stress can be relaxed by oxidizing the polysilicon gate electrode, and by putting the silicon oxide film between the polysilicon gate electrode and the silicon nitride film.

In the photoelectric conversion device of the present embodiment, the following thicknesses could be effectively adoptable. That is, the thickness of the silicon oxide film on the photodiode was within the range of 16–30 nm. The thickness of the silicon nitride film was within the range of 25–50 nm. The thickness of the gate oxide film was within the range of 7–16 nm. The thickness of the silicon oxide film on the side wall of the polysilicon electrode was within the range of 10–50 nm. Incidentally, the values required to the thicknesses of the gate oxide film and the side wall oxide film from the properties of the photoelectric conversion device are not determined uniquely. Consequently, even if thicknesses exceeding the respective thicknesses of the present embodiment, the thicknesses are not in contradictory to the sprit of the present invention.

Moreover, with respect to the manufacturing method of the present embodiment, additional oxidization may be preformed after the formation of the polysilicon electrode, or re-oxidization may be performed so as to form a desired film thickness after removing the silicon oxide film on the photodiode once. Moreover, the film seeds of the gate insulation film on the MOS transistor and the insulation film on the photodiode may be different from each other.

(Fourth Embodiment)

Figure 8:
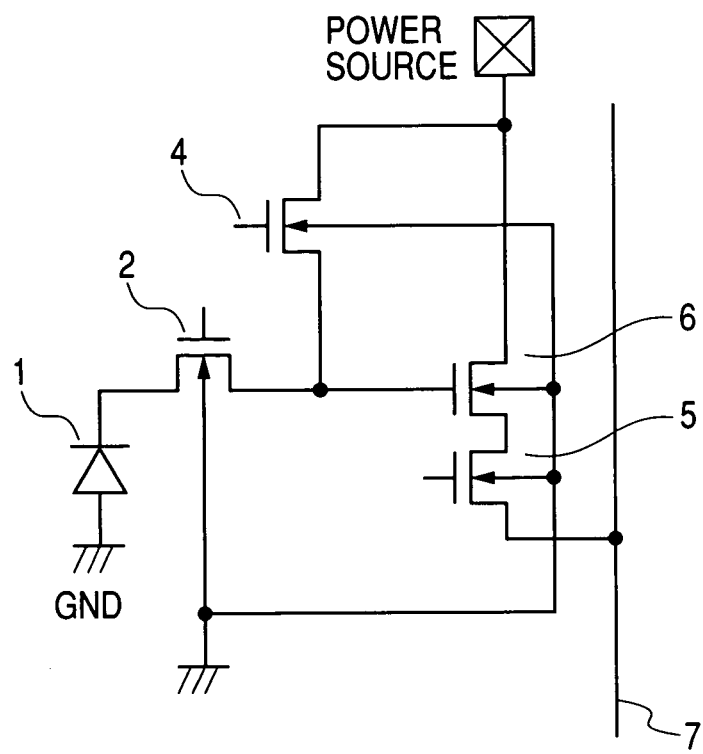
FIG. 8 is a circuit diagram of an equivalent circuit of a pixel of a CMOS sensor of a fourth embodiment of the present invention.
Figure 9:
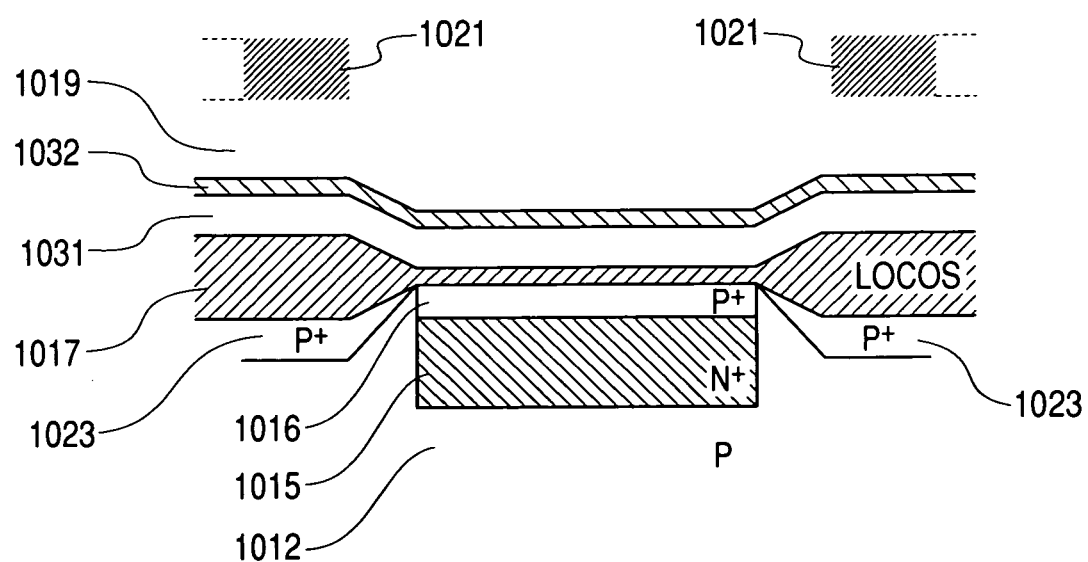
FIG. 9 is a sectional view of the pixel of the CMOS sensor of the fourth embodiment of the present invention.

FIG. 8 is a circuit diagram of an equivalent circuit of a unit pixel in a photoelectric conversions device of a fourth embodiment of the present invention. FIG. 9 is a schematic sectional view showing a region related to a reflection prevention film in the unit pixel of the photoelectric conversion device shown by the circuit diagram of the equivalent circuit of FIG. 8.

In FIG. 8, a photoelectric conversion portion 1 is connected to the gate of a source follower input MOS transistor 6 through a transfer MOS transistor 2. The source of the source follower input MOS transistor 6 is connected to a vertical signal line 7 through a selection MOS transistor 5. Moreover, a reset MOS transistor 4 for resetting the gate of the source follower input MOS transistor 6 to a predetermined potential is provided. Moreover, generally, ground (GND) wiring (not shown in FIG. 8) to be connected to the GND at every pixel is provided for suppressing the transient fluctuations of the GND potential at the time of driving.

The present embodiment further reduces the difference of refraction indices between a reflection prevention film and an interlayer insulation film to achieve the further reduction of a reflection ratio. The present embodiment is a photoelectric conversion device in which a plurality of pixels including photoelectric conversion portions is provided, and the embodiment is characterized in that two or more reflection prevention films are laminated above at least a part of the photoelectric conversion portions with an insulation film between. In particular, the present embodiment is characterized in that the refractive index of a second reflection prevention film is larger than the refractive index of the interlayer insulation film, and that the refractive index of a first reflection prevention film is larger than the second reflection prevention film. The present embodiment aims to suppress interface reflection by decreasing the difference between the refractive indices of the reflection prevention film and the interlayer insulation film.

Figure 10:
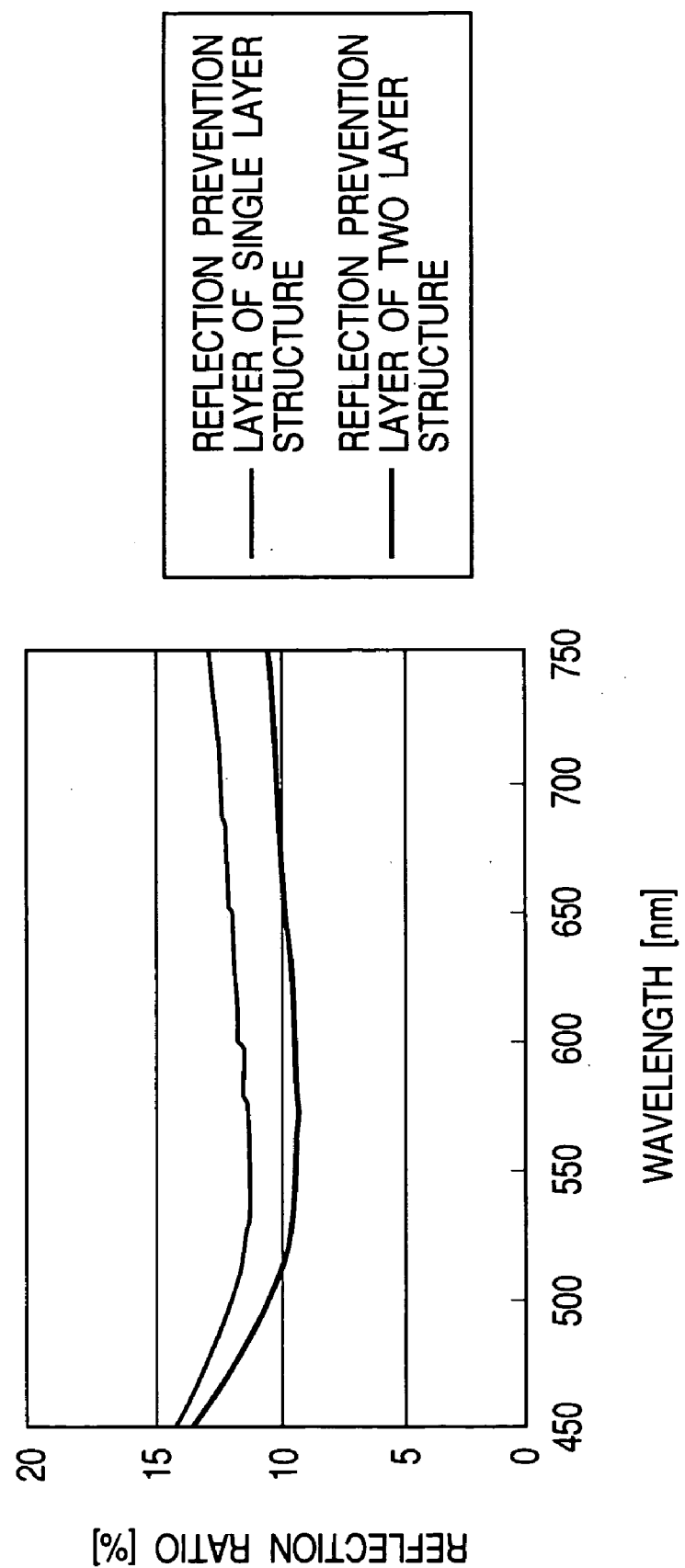
FIG. 10 is a graph showing an effect of the fourth embodiment of the present invention.

In FIG. 9, a reflection prevention film 1031 made of a silicon nitride is formed on silicon with a silicon oxide between. On the reflection prevention film 1031, a second reflection prevention film 1032 made of a silicon oxide nitride is formed. On the reflection prevention film 1032, an interlayer insulation film 1019 made of a silicon oxide is formed. The refractive index of the silicon nitride is about 2.0. The refractive index of the silicon oxide nitride is about 1.7. The refractive index of the silicon oxide is about 1.46. Moreover, the film thicknesses of the silicon nitride and the silicon oxide nitride are preferably within a range of 20–80 nm and a range of 5–30 nm, respectively. In particular, respective ranges are most preferably about 40 nm and 20 nm, respectively. As shown in FIG. 10, the reflection ratio of the photoelectric conversion device of two layer structure of the reflection prevention films is reduced in comparison with the reflection ratio of the photoelectric conversion device of the one layer structure of the reflection prevention film. The sensitivity of the photoelectric conversion device of the present embodiment is improved in almost all regions of the visible light.

Figure 11:
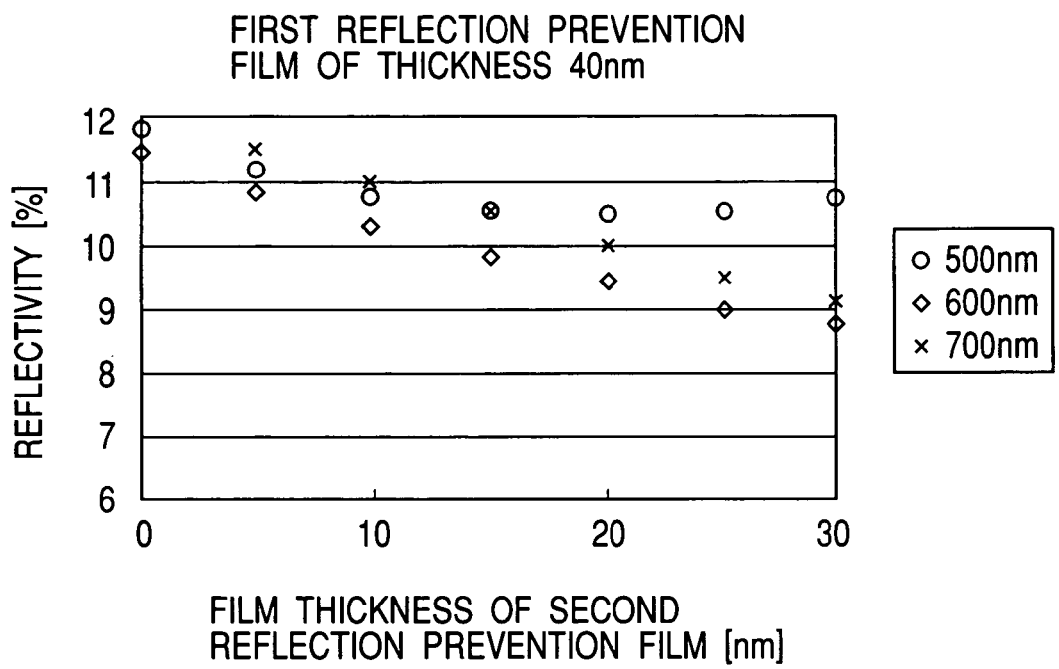
FIG. 11 is a graph showing the reflectivity of each wavelength to the film thicknesses of a second reflection prevention film of the fourth embodiment of the present invention.

Moreover, relations between the film thickness of a reflection prevention film and the refractive index thereof will be described in detail. For example, in the case where the film thickness of the silicon oxide right above the photoelectric conversion portion is made to be about 8 nm and the film thickness of the first reflection film made of the silicon nitride with a silicon oxide on the silicon between is made to be 40 nm, the refractive indices of each wavelength to the film thicknesses of the second reflection prevention film made of the silicon oxide nitride formed right above the first reflection prevention film are values shown in FIG. 11. That is, by setting the film thickness of the second reflection prevention film to be about 20 nm or less, it becomes possible to decrease the reflection ratio in the whole region of the visible light. Moreover, if the film thickness of the second reflection film is about 20 nm or more, the reflection ratio in the long visible light wave length region of the wave length about 600 nm or 700 nm is further lowered. However, because the reflection ratio in the short visible light wave length region of the wave length about 500 nm or less passes through a peak of the minimum reflection ratio to have a tendency of increasing the reflection ratio, it is most preferable to set the film thickness to be 20 nm or less. However, if the film thickness is 30 nm or less, it is possible to determine the film thickness by treating the sensitivity allocation as a designing matter.

Figure 12:
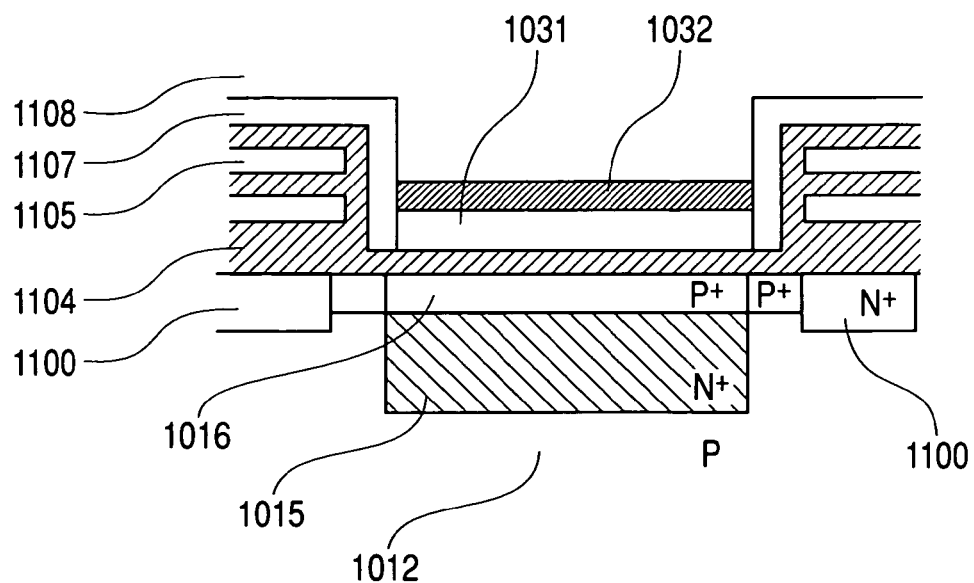
FIG. 12 is a schematic sectional view showing a variation of the fourth embodiment of the present invention.

Moreover, the present embodiment can be also applied to a CCD solid state image pickup device. FIG. 12 is a schematic sectional view showing the region related to a reflection prevention film in the sectional structure of a unit pixel of a CCD solid state image pickup device. Also in the present structure, the effect of improving the sensitivity can be obtained like the CMOS sensor.

(Fifth Embodiment)

Figure 13:
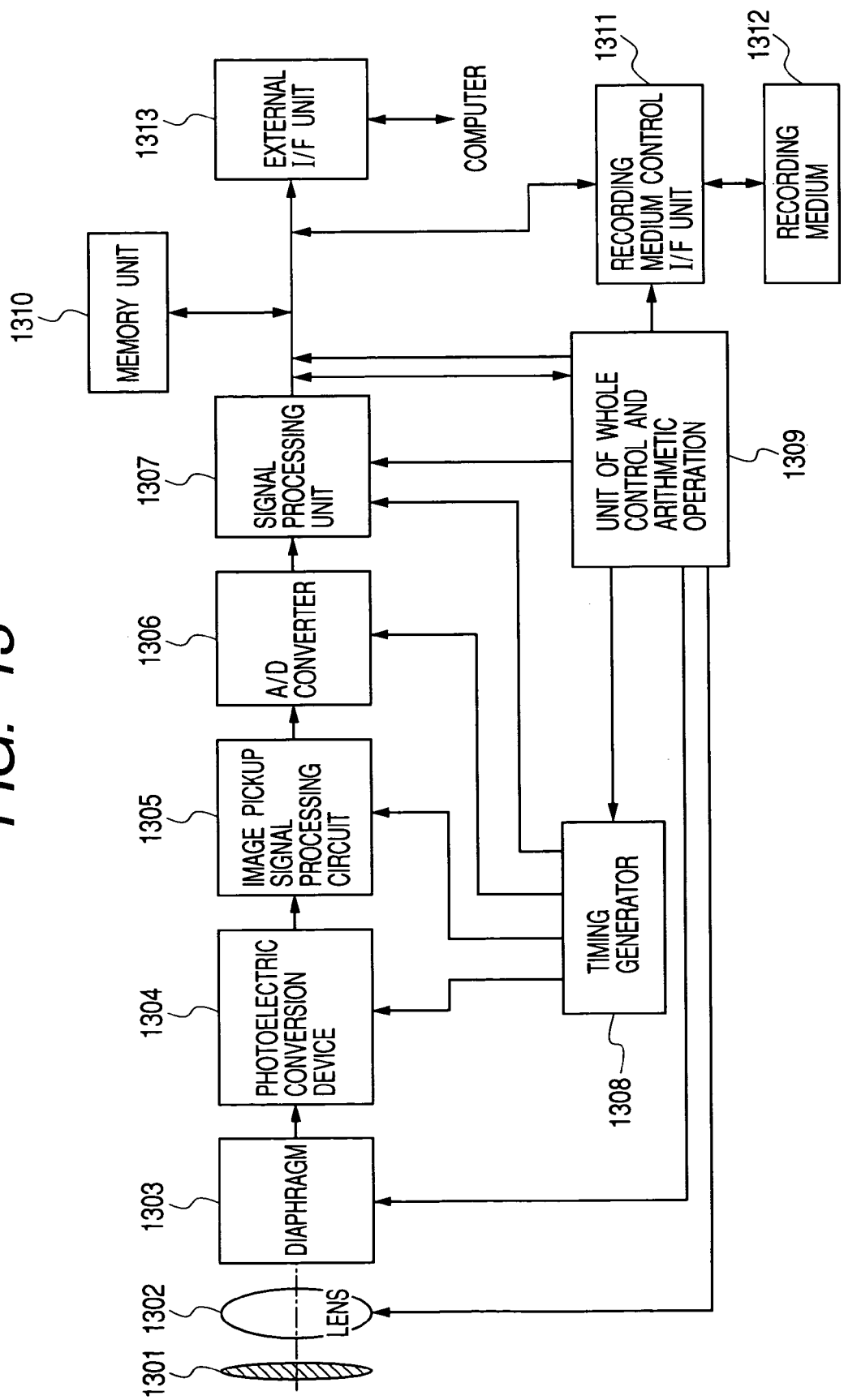
FIG. 13 is a block diagram of a camera system using a photoelectric conversion device according to the present invention.
Figure 14:
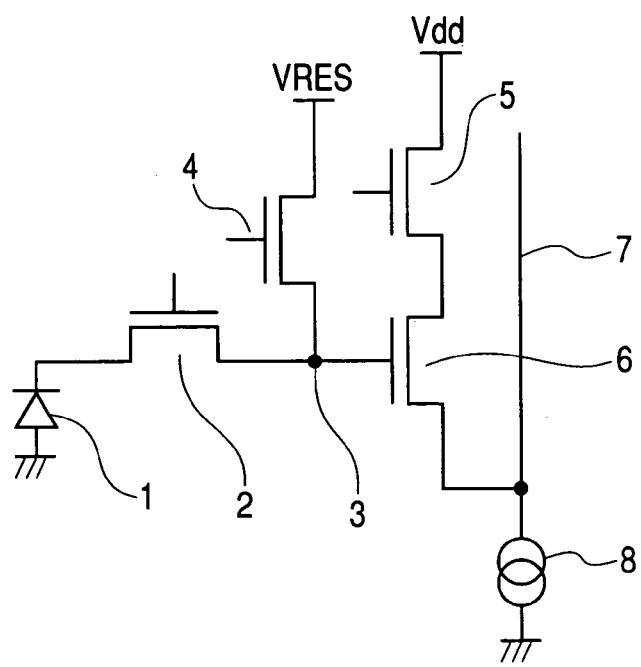
FIG. 14 is a general circuit configuration diagram of a pixel carrying a CMOS sensor.
Figure 15:
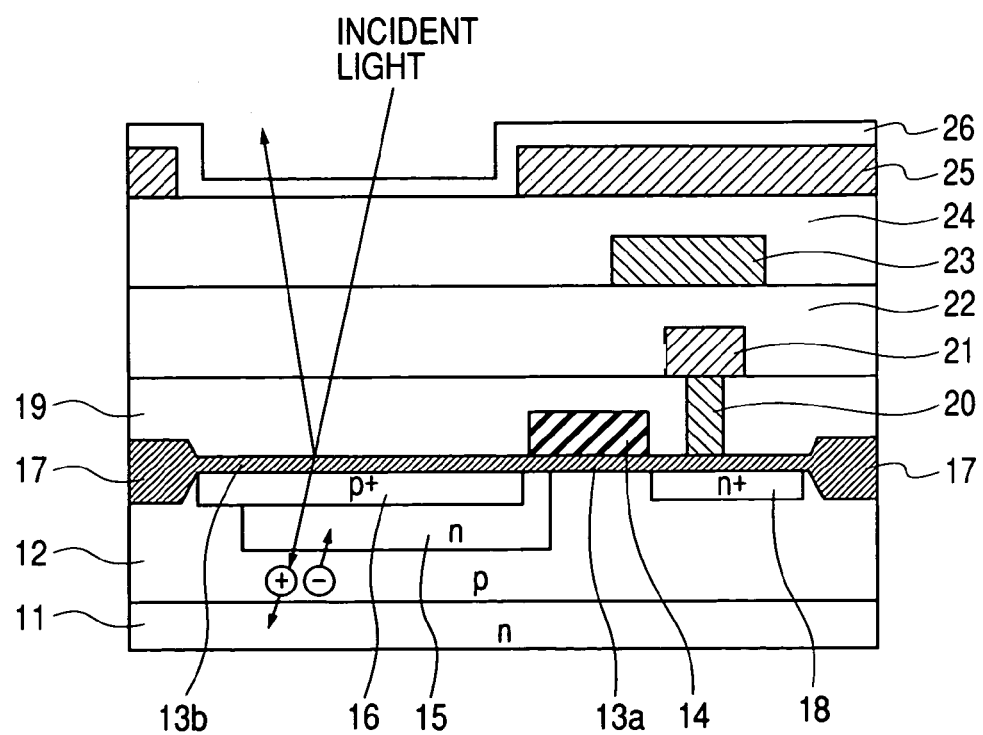
FIG. 15 is a schematic sectional view of a pixel carrying a conventional CMOS sensor.

FIG. 13 shows an example of a circuit block in the case where the photoelectric conversion device of the present invention is applied to a camera. A shutter 1301 is located before a taking lens 1302. The shutter 1301 controls exposure. A light quantity is controlled by a diaphragm 1303 as the need arises. The taking lens 1302 forms an image on a photoelectric conversion device 1304. A signal output from the photoelectric conversion device 1304 is processed by an image pickup signal processing circuit 1305. The processed signal is converted from an analog signal to a digital signal by an analog to digital (A/D) converter 1306. The output digital signal is further arithmetically processed by a signal processing unit 1307. The processed digital signal is stored in a memory 1310, or is transmitted to external equipment through an external interface (I/F) 1313. The photoelectric conversion device 1304, the image pickup signal processing circuit 1305, the A/D converter 1306 and the signal processing unit 1307 are controlled by timing generator 1308. Besides, the whole system is controlled by a unit of whole control and arithmetic operation 1309. For recording images in a recording medium 1312, an output digital signal is recorded through a recording medium control I/F unit 1311, which is in turn controlled by the unit of whole control and arithmetic operation 1309.

The present invention relates to a photoelectric conversion device in which a reflection prevention film having a refractive index higher than that of an insulation film is arranged above a light receiving region with the insulation film between, and to a method for manufacturing the photoelectric conversion device. In particular, the present invention is suitably used for an amplification type MOS solid state image pickup device.

The photoelectric conversion device and the method for manufacturing the photoelectric conversion device according to the present invention are suitably used in digital imaging equipment such as a digital still camera, a digital video camera, an image scanner and a portable telephone equipped with a digital still camera.

What is claimed is:

1. A photoelectric conversion device including pixels arranged in an array, each of said pixels comprising:
    a light receiving region for converting light to signal charges;
    transistors including an amplifying transistor for amplifying the signal charges to output the amplified signal charges; and
    an insulation film arranged on a surface of said light receiving region and under gate electrodes of said transistors,
    wherein a reflection prevention film made of a silicon nitride film is arranged at least above said light receiving region with said insulation film arranged between said reflection prevention film and said light receiving region, and
    film thicknesses of a first region of said insulation film arranged on a surface of said light receiving region and of a second region of said insulation film arranged under said gate electrodes of said transistors are different from each other, and
    wherein an interlayer insulation film is arranged on said reflection prevention film, and
    a second reflection prevention film made of a silicon oxide nitride film is laminated between said reflection prevention film and said interlayer insulation film.

2. A photoelectric conversion apparatus according to claim 1, wherein said transistors include a transfer transistor for transferring signal charges from said light receiving region, and
    said reflection prevention film is arranged on a side surface of a gate electrode of a transfer transistor and/or above a gate electrode of said transfer transistor.

3. A photoelectric conversion device according to claim 1, wherein said insulation film is a silicon oxide film.

4. A photoelectric conversion device according to claim 3, wherein said silicon oxide film is arranged on side walls of said gate electrodes of said transistors.

5. A photoelectric conversion device according to claim 1, wherein said reflection prevention film is isolated from a reflection prevention film in an adjoining pixel.

6. A photoelectric conversion device according to claim 1, wherein said reflection prevention film is a silicon nitride film containing a large quantity of hydrogen molecules.

7. A camera system comprising a photoelectric conversion device according to claim 1.

8. A photoelectric conversion device including pixels arranged in an array, each of said pixels comprising:
    a light receiving region for converting light to signal charge;
    transistors including an amplifying transistor for amplifying the signal charges to output the amplified signal charges;
    an insulation film made of a silicon oxide film and arranged on a surface of said light receiving region and under gate electrodes of said transistors; and
    a multi-layer wiring structure,
    wherein an interlayer insulation film made of a silicon oxide film is arranged between the gate electrodes of said transistors and wiring for insulating said gate electrodes and said wiring; and
    a first reflection prevention film made of a silicon nitride film,
    wherein said first reflection prevention film is arranged at least above said light receiving region, with said insulation film arranged between said first reflection prevention film and said light receiving region,
    wherein a second reflection prevention film made of a silicon oxide nitride film is laminated between said first reflection prevention film and said interlayer insulation film, and
    film thicknesses of said insulation film arranged both on said surface of said light receiving region and under said gate electrodes of said transistors are different from each other.

* * * * *

UNITED STATES PATENT AND TRADEMARK OFFICE
CERTIFICATE OF CORRECTION

| | | |
|---|---|---|
| PATENT NO. | : 7,126,102 B2 | |
| APPLICATION NO. | : 10/747369 | |
| DATED | : October 24, 2006 | |
| INVENTOR(S) | : Shunsuke Inoue et al. | |

It is certified that error appears in the above-identified patent and that said Letters Patent is hereby corrected as shown below:

ON TITLE PAGE [56] REFERENCES CITED :

Foreign Patent Documents, "JP   2000-12822   1/2000" should be deleted; and "JP   2001291857   A   10/2000" should be deleted.

COLUMN 2:

Line 60, "called as" should read --known as--.

COLUMN 3:

Line 13, "has occupied" should read --have occupied--; and "in the whole" should read --in the overall scheme of--.

COLUMN 4:

Line 23, "available at in a" should read --available in a--;
    Line 34, "it is prevented" should be deleted;
    Line 35, "for the silicon" should read --the silicon--; and "prevention film" should read --prevention film is prevented--; and
    Line 67, "primary" should read --a primary--.

COLUMN 5:

Line 22, "to lowering" should read --to lower--.

COLUMN 7:

Line 19, "*silicon" should read --silicon--;
    Line 20, "a case" should read --an example--;
    Line 51, "sprit" should read --spirit--; and
    Line 61, "sprit" should read --spirit--.

COLUMN 8:

Line 48, "convenience" should read --convenience's--.

UNITED STATES PATENT AND TRADEMARK OFFICE
CERTIFICATE OF CORRECTION

PATENT NO. : 7,126,102 B2
APPLICATION NO. : 10/747369
DATED : October 24, 2006
INVENTOR(S) : Shunsuke Inoue et al.

It is certified that error appears in the above-identified patent and that said Letters Patent is hereby corrected as shown below:

COLUMN 9:

Line 32, "made," should read --made--;
    Line 36, "of course" should read --a matter of course--; and
    Line 62, "an photoelectric" should read --a photoelectric--.

COLUMN 10:

Line 26, "sprit" should read --spirit--;
    Line 57, "exceeding" should read --exceed--; and
    Line 58, "in contradietory" should read --contradictory--.

COLUMN 11:

Line 52, "two layer" should read --the two layer--.

Signed and Sealed this

Twenty-eighth Day of August, 2007

JON W. DUDAS
*Director of the United States Patent and Trademark Office*